United States Patent
Holmes et al.

[11] 3,936,751
[45] Feb. 3, 1976

[54] SWD FM DETECTOR AND IF FILTER

[75] Inventors: Jerry D. Holmes, Dallas, Tex.;
Benjamin L. Lowe, Huntsville, Ala.;
Samuel D. Moore, Plano, Tex.

[73] Assignee: Texas Instruments Incorporated,
Dallas, Tex.

[22] Filed: Sept. 5, 1974

[21] Appl. No.: 503,943

[52] U.S. Cl.............. 325/347; 333/30 R; 325/349;
329/119
[51] Int. Cl.²........................................ H04B 1/16
[58] Field of Search...... 325/347, 348, 439; 333/30,
333/72; 329/117, 119

[56] References Cited
UNITED STATES PATENTS

| | | | |
|---|---|---|---|
| 3,835,422 | 9/1974 | Hartmann | 325/349 |
| 3,843,932 | 10/1974 | Fishman | 333/30 R |
| 3,848,144 | 11/1974 | Schissler | 333/30 R |

Primary Examiner—Albert J. Mayer
Attorney, Agent, or Firm—Harold Levine; James T. Comfort; James O. Dixon

[57] ABSTRACT

An SWD structure is employed in an FM receiver for signal demodulation and band limiting. An FM signal is applied to the input of an SWD patterned for bandwidth limitation. Two SWD output channels characterized by predetermined differential delays of the modulated input signal are amplitude limited and mixed to produce an audio modulation component.

13 Claims, 11 Drawing Figures

3,936,751

SWD FM DETECTOR AND IF FILTER

FIELD OF THE INVENTION

This invention relates to detection demodulation of frequency modulated signals. In a more specific aspect, it relates to a system which lends itself to fabrication using high technology procedure and which avoids IF alignment problems in the manufacture of FM receiver systems.

PRIOR ART

In conventional FM receivers, a modulated RF carrier signal is passed from an antenna through an RF amplifier to a first mixer which in the input signal is heterodyned with a signal from a local oscillator to produce an intermediate frequency (IF) signal. This IF signal is then passed through a bandpass amplifier whose output is applied to a limiter-discriminator unit where variations in carrier amplitude are eliminated, and variations in carrier frequency are converted into equivalent audio amplitude variations. The demodulated audio output signal is representative of the modulation imposed on the RF carrier sensed by the antenna.

In practice, the bandwidth of an FM broadcast signal is of the order of 150 to 200 KHz. The frequency response of the amplifier, therefore, must be sufficiently wide to pass a 150 to 200 KHz band. Thus, in the IF portion of a receiver system, provision has been required for the alignment of filters. Traditionally, the filters have been manually tuned through screw driven adjustments of a magnetic core within an IF signal channel coil.

The present invention is directed to a system which employs an acoustic surface wave device (SWD) to avoid the necessity for such adjustments, and which provides for simultaneous band limiting and demodulation.

The construction, uses and advantageous characteristics of acoustic surface wave bandpass filter device for use in the IF stage of a television receiver are shown in prior art patents such as U.S. Pat. Nos. 3,550,045; 3,559,115; 3,573,673; 3,581,248; 3,582,540; 3,582,838; 3,582,840; 3,596,211; 3,600,710; and 3,626,309. In addition, U.S. Pat. No. 3,787,612 discloses a number of signal processing circuits for a television receiver which include SWDs for improved tuning and video demodulation. Each of the reference patents are assigned to the assignee of the present invention.

SUMMARY OF THE INVENTION

In accordance with the present invention, an FM signal is applied to a surface wave device (SWD) from which there are extracted two output signals having a differential relative delay. The output signals are then applied to two inputs of a mixer in which the input voltages are multiplied and from which an output component representative of the audio frequency modulation is extracted.

In a more specific aspect, there is provided an FM receiver system comprising an SWD patterned for band limitation and having two IF outputs characterized by a differential delay T which is eqal to $n\pi/2\omega_0$, where $n$ is an odd integer and $\omega_0$ is the IF radian frequency. The SWD outputs are amplitude limited and applied to a mixer to produce the audio modulation component.

DESCRIPTION OF THE DRAWINGS

The novel features believed characteristic of the invention are set forth in the appended claims. The invention itself, however, as well as further objects and advantages thereof, will be best understood by reference to the following detailed description of an illustrative embodiment taken in conjunction with the accompanying drawings, in which:

DESCRIPTION OF PREFERRED EMBODIMENTS

Figure 1:
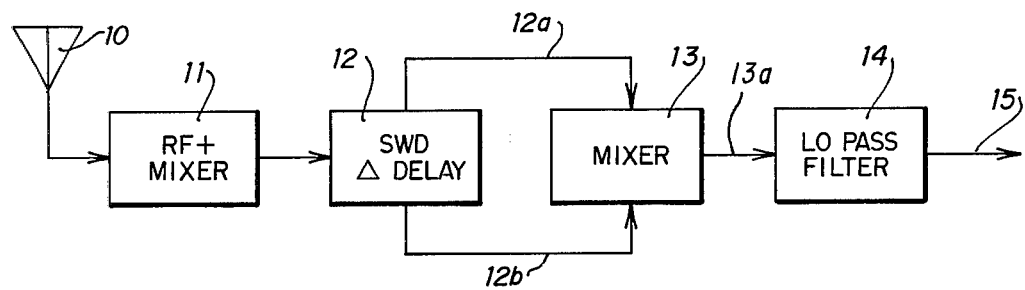
FIG. 1 is a block diagram of a system embodying the invention.

The present invention is directed to a demodulation system for use in UHF and VHF FM receivers such as employed in FM broadcast and television reception. FIG. 1 illustrates a system in which the invention is employed wherein a signal received by an antenna 10 is applied through an RF section 11 to a surface wave device (SWD) 12 having a unique and particular characteristic such that in combination with a mixer 13, significant circuit simplification is accomplished in FM demodulation and IF filtering of unwanted frequencies. By placing limiter amplifiers after the SWD delay line, the frequency filter characteristics of the SWD 12 is used as the IF filter. Thus, a simplified design and construction of an entire receiver system is provided which requires no tuning of the IF stages.

More particularly, as shown in FIG. 1, a first output 12a of SWD 12 is applied as one input to mixer 13, whereas a second output 12b is supplied as the second input to mixer 13. The output appearing on line 13a is applied through a low-pass filter 14 to an audio output channel 15. Unique characteristics of the system revolve around the fact that the outputs of the SWD 12 appearing on lines 12a and 12b both undergo a first delay Δ, with one of then undergoing an additional delay totaling Δ + T such that it is 90° shifted from the other output. That is, output 12a is 90° out of phase with the output 12b.

The signal applied to the input of SWD 12 may be of the form described as follows:

$$\text{Cos}\,[(\omega_0+\omega_m)t], \qquad (1)$$

where $\omega_0$ is the RF carrier radian frequency and $\omega_m$ is the modulation frequency.

The output signal on line 12a then would have the form of the following expression:

$$\cos[(\omega_0+\omega_m)(t+\Delta)] \quad (2)$$

In contrast, the output signal on line 12b would have the form of the following expression:

$$\cos[(\omega_0+\omega_m)(t+\Delta+T)] \quad (3)$$

The mixer then carries out the function of multiplying the two signals, the product of which may be expressed as follows: $2\cos x \cos y = \cos(x+y) + \cos(x-y)$ (4)

Mixer 13 would then have two outputs, one representing the sum of the IF input frequencies and the other the difference between the IF frequencies. The difference term may be expressed as follows: $\cos(x-y) = \cos[(\omega_0+\omega_m)T]$ (5)

In this equation, both $\omega_0$ and the time delay T are constants. Therefore, the only variable is the modulation component $\omega_m T$. This audio modulation is then the output signal which is to vary as $k\omega_m T$, where $k$ is a proportionality factor.

Figure 2:
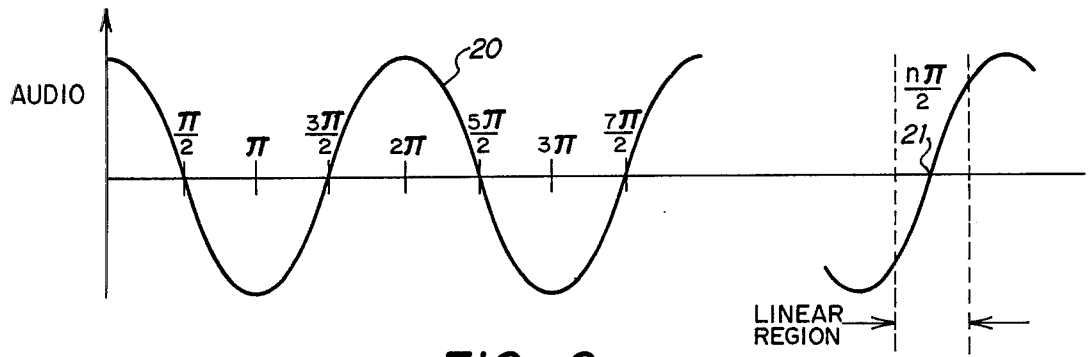
FIG. 2 is a waveform illustrating operation of the system of FIG. 1.

In order for the mixer 13 to operate in the linear region, it is desirable that the term $\omega_0 T = n\pi/2$, where $n$ is an odd integer. For good linearity, it is desirable that the expression $\omega_m T$ be less than about $\pi/6$ in order to stay in the linear region of a cosine curve. As shown in FIG. 2, the output waveform may take the shape represented by the curve 20. This curve is a cosine curve passing through zero at $\pi/2$, having a negative maximum at $\pi$, passing through zero at $3\pi/2$ and having a positive maximum at $2\omega$. So long as $n$ is an odd integer, the mixer 13 will operate on the portion of the cosine curve which passes through zero. At points $\pi/2$ and $5\pi/1$, etc. the phase of the audio output signal is 180° from that detected if the operation is selected at $3\pi/2$ or $7\pi/2$, etc. Thus, the time delay fixes the point at which the mixer is to operate, the bias point 21 being indicated in FIG. 2.

As the modulating signal $\omega_m$ achieves values between its permissible limits, $\pm\omega_{max}$, the audio output voltage will vary approximately linearly with the instantaneous frequency excursion $\omega_m$ about the bias point which is determined by $\omega_0$. Consequently, proper selection of the parameters of $\omega_0 T$ and $\omega_{max}$ will permit accurate and substantially distortionless demodulation of a frequency modulated waveform.

Figure 3:
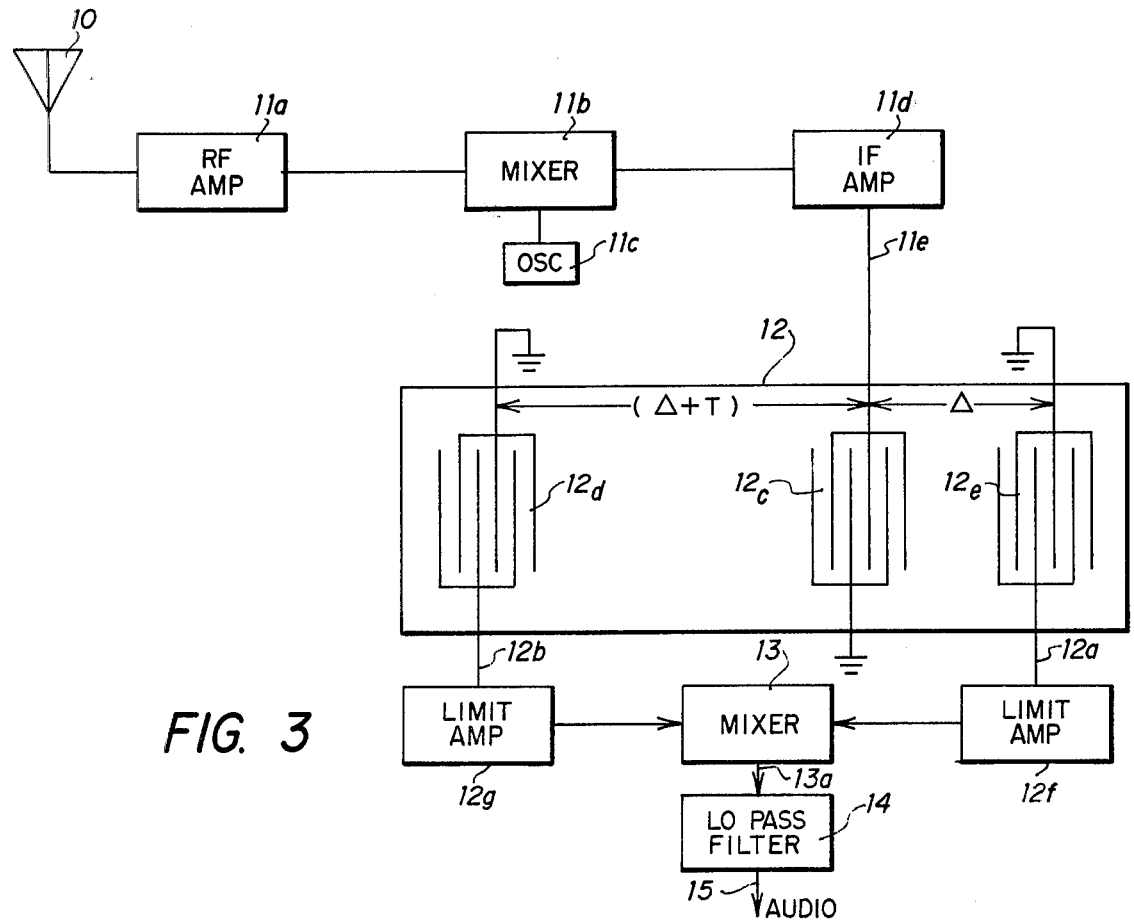
FIG. 3 is a schematic diagram illustrating one embodiment of the invention.

FIG. 3 illustrates one embodiment of the invention, where the antenna 10 feeds the RF section of the receiver comprising an RF amplifier 11a. Amplifier 11a supplies one input of a first mixer 11b, the second input of which is supplied by a local oscillator 11c.

An IF amplifier 11d preferably is provided with gain sufficient to prevent the insertion loss of the succeeding SWD from degrading the noise figure of the receiver system. The output of the IF amplifier appearing on channel 11e is then connected to the input or launching section 12c of an SWD 12. The SWD in this form serves as a delay line-filter. Surface waves traveling from the launch section 12c are detected by the output section 12d after a delay $\Delta$, and by the output section 12e after a delay $\Delta + T$.

The SWD 12 is made such that the output signals on the channels 12a and 12b are the input signals filtered and delayed by a relative delay of T. The output on line 12a is connected to a limiting amplifier 12f, while the output on line 12b is connected to a limiting amplifier 12g. The outputs of amplifiers 12f and 12g are connected as inputs to mixer 13, the output of which is connected by way of line 13a to low-pass filter 14 to produce an audio output on channel 15.

The input or launch section 12c of SWD launches acoustic surface waves having a center frequency and a bandwidth determined by the design of the interdigital electrodes forming the section. The acoustic waves propagate across the surface of the SWD 12 and are received by the output sections 12d and 12e for transduction into signals suitable for delivery through amplifiers 12f and 12g to mixer 13.

Although a wide variety of constructions and arrangements can be employed to achieve a combined delay and filtering function, a preferred form involves a single substrate of piezoelectric characteristics having electrically conductive interdigital metallic lines formed thereon suitable for use at the IF frequencies. In general, the details of construction and operation of surface wave devices and materials in configurations thereof are well-known in the art. Thus, for the purpose of the present invention the device will be made in accordance with such prior art techniques to provide outputs having a time delay difference T as above described.

Figure 4:
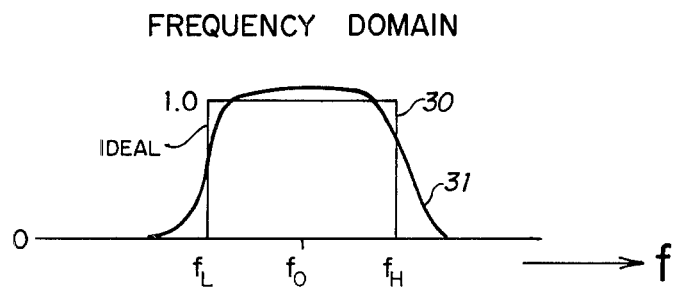
FIG. 4 is a diagram illustrating a bandpass characteristic in the frequency domain.

The system of the present invention provides modification of the IF signal on line 11e to combine the dual function of filtering and detection. As shown in FIG. 4, an ideal SWD bandpass filter would have the response presented by the curve 30. In practice, more realistic achievements are represented by curve 31.

The SWD bandpass filter has high conductance for signals within the frequency band $f_L-f_H$, and attenuation above and below the band. The filter characteristic illustrated in FIG. 4 is expressed in the frequency domain to represent the impulse of a desired filter. Since the SWDs employed in the present invention are essentially time domain devices, it is helpful to consider the filter characteristics illustrated in FIG. 4 transformed into the time domain.

Figure 5:
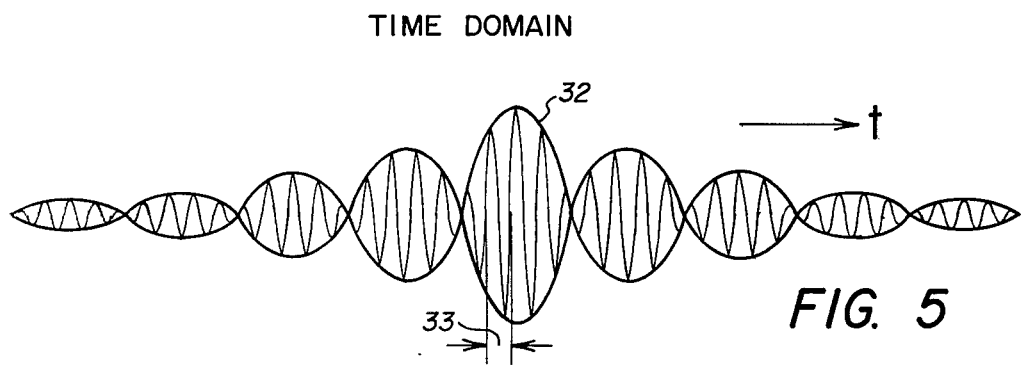
FIG. 5 illustrates the same bandpas characteristic in the time domain.

FIG. 5 illustrates in the time domain the impulse response of a filter having the bandpass characteristics of FIG. 4. The envelope 32 represents the filter response, and the time interval 33 represents the period of the waveform being filtered. In the present case, interval 33 is equal to $1/f_0$, i.e., the intermediate frequency.

Figure 6:
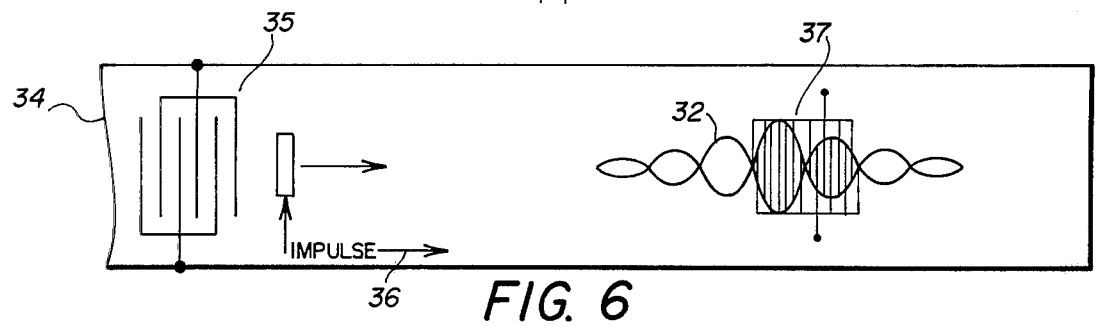
FIG. 6 illustrates a filter of the type characterized in FIG. 5 on a piezoelectric wafer forming a surface wave device.

A filter having the characteristics illustrated in FIG. 5 may be executed in SWD form in the manner illustrated in FIG. 6. A piezoelectric wafer 34 is provided with a set of interdigitated electrodes 35 which serve to launch an acoustic impulse down the wafer in the direction of arrow 36. Output electrodes 37 are then formed to have variable length, the length being varied in accordance with the waveform 32 of FIG. 5. The variable length of the interdigitated electrodes causes variable overlap, the extent of which is dictated by the waveform 32. The present invention involves the use of the SWD 34 to provide the time delays illustrated in FIG. 3 as well as the filtering illustrated in FIG. 6, where the filter serves the purpose of passing only the IF frequencies of interest.

Figure 7:
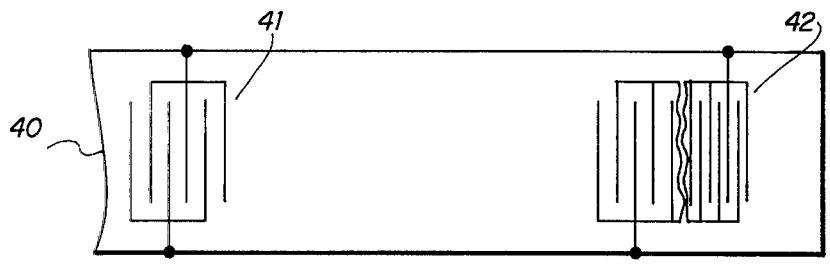
FIG. 7 illustrates a TRF system embodying the invention with only output electrodes tuned.

FIG. 7 illustrates an alternate form of bandpass filter. A piezoelectric wafer 40 is provided with an input set of electrodes 41 and an output set 42. The spacing of the electrodes in set 42 at the left end thereof is such that they are tuned to the frequency $f_L$ of FIG. 4, whereas the spacing on the right-hand end is such that the sensor is tuned to the frequencies $f_H$. Thus, in this system, only the receiving or output set of electrodes is tuned.

Figure 8:
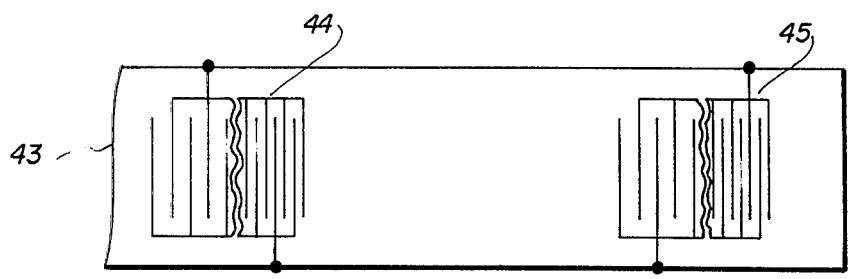
FIG. 8 illustrates a TRF system embodying the invention with both input and output electrodes tuned.

Preferably, a variable spacing system would be constructed as shown in FIG. 8 wherein the input as well as the output set of electrodes are tuned. More particularly, wafer 43 is provided with an input set of electrodes 44 which have constant overlap but vary in spacing to launch the acoustic waves limited to the band to which the spacings are tuned. The output set 45 is similarly tuned. The pattern of output electrode spacings is such that the high frequency components will travel through the wafer 43 the same distance as the low frequency components.

Figure 9:
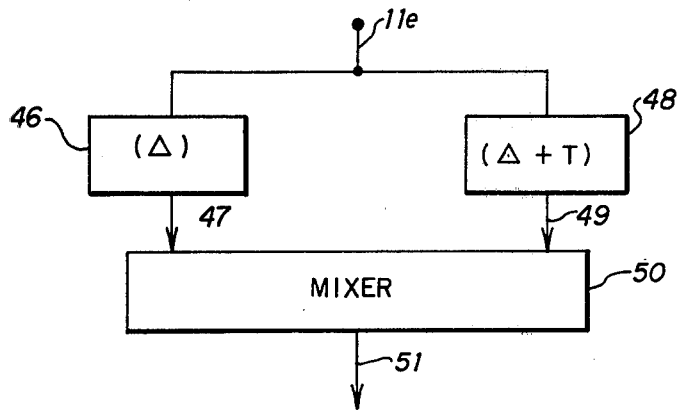
FIG. 9 is a block diagram of one modification to the embodiment illustrated in FIG. 3.

In FIG. 3, a single chip wafer is employed for the SWD. However, the time delays $\Delta$ and $\Delta + T$ may be achieved by using a pair of SWDs as shown in FIG. 9. In this system, the signal input channel 11e leading to the SWDs leads to a first SWD 46 to provide an output signal on line 47 having a time delay $\Delta$. A second SWD 48 provides a signal output on line 49 having a time delay $\Delta + T$. These two signals are than applied to unit 50 which includes limiting amplifiers and a mixer so that the output on line 51 may then be applied to a low pass filter as in FIG. 3.

Figure 10:
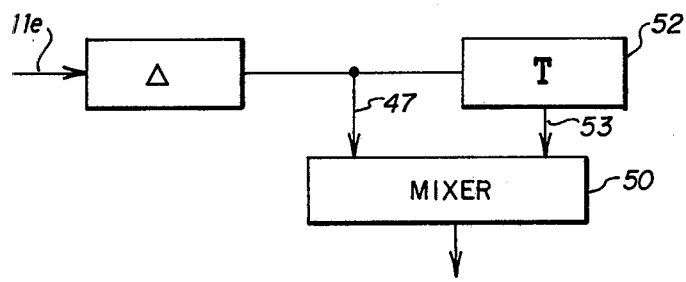
FIG. 10 is a block diagram of a second modification to the embodiment of FIG. 3.

In a further modification shown in FIG. 10, the input line 11e leads to a first SWD 46 which may be the same as in FIG. 9. The output is then applied both to mixer 50 and to a second SWD 52 having a time delay T. Thus, the signal on lines 47 and 53 have time delays $\Delta$ and $\Delta + T$, respectively.

Figure 11:
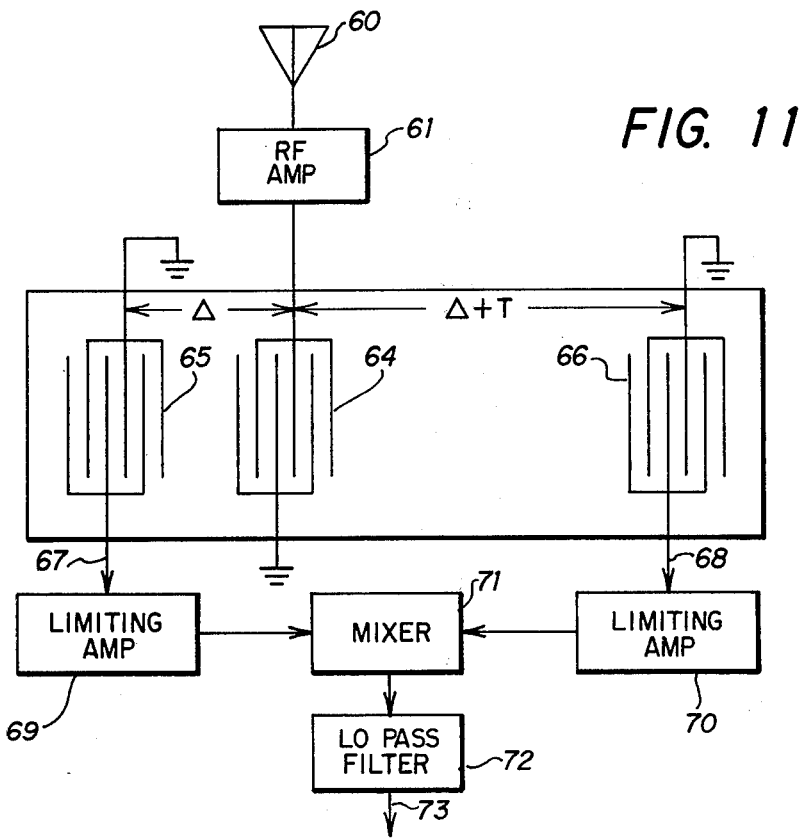
FIG. 11 illustrates an embodiment of the invention applicable to heterodyne receivers.

In a further application of the invention, a receiver of the tuned radio frequency variety has been illustrated in FIG. 11, wherein an antenna 60 is connected to an RF amplifier 60 whose output is applied by way of line 62 to an SWD 63. SWD 63 comprises a launching or input section 64 and two output sections 65 and 66. The output section 65 provides an output on line 67 which is delayed by an interval $\Delta$, and an output on line 68 delayed by an interval $\Delta + T$. As in FIG. 3, these signals are then applied by way of limiting amplifiers 69 and 70 to a mixer 71 whose output is applied through a low pass filter 72 to provide an audio output signal on line 73. Thus, the invention is applicable to heterodyne type of receivers as well as to TRF receivers.

It will be appreciated that TRF receivers are utilized in many operations. They generally require a high gain which is difficult to secure without experiencing instability and local oscillator. However, the TRF receivers herein described have the advantage that they do not have local oscillator signal that can be sensed. Thus, they may be used as clandestine receivers operating at short distances in high RF field environments where they can operate without being detectable.

Having described the invention in connection with certain specific embodiments thereof, it is to be understood that further modifications may now suggest themselves to those skilled in the art and it is intended to cover such modifications as fall within the scope of the appended claims.

What is claimed is:

1. In a radio receiver, the combination comprising:
    a. an SWD structure providing two channels each with an input section and an output section, said channels having different spacing between their input and output sections respectively such that predetermined different delays are imposed on modulated signals passing through said channels,
    b. a mixer,
    c. means to apply a modulated input signal to said input sections of said SWD structure, and
    d. means to receive output signals from each of said output sections and to apply said output signals from said two channels to said mixer to produce at the output of said mixer an audio output signal representing the modulation of said input signal.

2. The system of claim 1 in which said delays differ by a factor T which is $n\pi/2\omega_0$, where $n$ is an odd integer and $\omega_0$ is the radian frequency of said input signal.

3. The system of claim 1 in which said SWD structure is patterned to limit the bandwidth of signals passed to said mixer.

4. The system of claim 1 in which said SWD structure is unitary.

5. The combination set forth in claim 1 in which said SWD structure comprises two separate piezoelectric wafers each with an input and an output set of electrodes and in which the spacings differ to introduce a differential time delay $T = n\pi/2\omega_0$ between the signals from said two wafers where $n$ is an odd integer and $\omega_0$ is the radian frequency of said input signal.

6. The combination set forth in claim 1 wherein electrodes on said structure are variably interdigitated to pass frequencies only of a predetermined band.

7. The combination set forth in claim 1 wherein electrodes on said structure are variably spaced to pass frequencies only of a predetermined band.

8. The system of claim 1 in which said SWD structure has an input set of electrodes and two output sets to sense waves traveling in opposite directions in said structure.

9. In an IF section of an FM receiver, the combination comprising:
    a. an SWD having an input section and two output sections defining two separate channels of different lengths and characterized by predetermined different delays of an input signal of the IF frequency passing through said channels,
    b. a mixer,
    c. means to apply an FM signal to said input section, and
    d. means to receive signals from each of said two output sections and apply said signals to said mixer to produce at the output of said mixer an audio output signal representing the modulation of said input signal.

10. The system of claim 9 in which said delays differ by a factor T which is $n\pi/2\omega_0$, where $n$ is an odd integer and $\omega_0$ is the IF radian frequency.

11. The system of claim 9 in which said SWD is patterned to limit the bandwidth of signals passed to said mixer.

12. The method of demodulating an input signal which comprises:
    a. generating an acoustic wave corresponding to said input signal,
    b. detecting said wave after a delay $\Delta$ and producing a first filtered electrical signal corresponding to said wave detected after said delay,
    c. detecting said wave after a delay $\Delta + T$ and producing a second filtered electrical signal corresponding to said wave detected after said last delay,
    d. mixing said first and second electrical signals, and
    e. filtering the signal resulting from mixing to pass modulation frequencies.

13. The method of claim 12 in which $T = n\pi/2\omega_0$, where $n$ is an odd integer and $\omega_0$ is the radian frequency of said input signal.

* * * * *